(12) United States Patent
Wang et al.

(10) Patent No.: US 11,985,864 B2
(45) Date of Patent: May 14, 2024

(54) DISPLAY PANEL AND METHOD OF MANUFACTURING SAME, AND DISPLAY DEVICE

(71) Applicants: Hefei BOE Joint Technology Co., Ltd., Anhui (CN); BOE Technology Group Co., Ltd., Beijing (CN)

(72) Inventors: Xinxin Wang, Beijing (CN); Minghung Hsu, Beijing (CN)

(73) Assignees: Hefei BOE Joint Technology Co., Lid., Anhui (CN); BOE Technology Group Co., Ltd., Beijing (CN)

( * ) Notice: Subject to any disclaimer, the term of this patent is extended or adjusted under 35 U.S.C. 154(b) by 257 days.

(21) Appl. No.: 17/506,532

(22) Filed: Oct. 20, 2021

(65) Prior Publication Data

US 2022/0130926 A1 Apr. 28, 2022

(30) Foreign Application Priority Data

Oct. 22, 2020 (CN) .......................... 202011140259.8

(51) Int. Cl.
*H01L 27/32* (2006.01)
*H01L 51/56* (2006.01)
(Continued)

(52) U.S. Cl.
CPC ......... *H10K 59/122* (2023.02); *H10K 50/824* (2023.02); *H10K 71/00* (2023.02); *H10K 59/1201* (2023.02)

(58) Field of Classification Search
CPC ........... H10K 59/122; H10K 59/80522; H10K 50/824
See application file for complete search history.

(56) References Cited

U.S. PATENT DOCUMENTS

2003/0197466 A1* 10/2003 Yamazaki ............ H10K 59/122
                                                    313/504
2004/0185604 A1*  9/2004 Park ........................ H01L 27/12
                                                    438/149
(Continued)

FOREIGN PATENT DOCUMENTS

CN    107359258 A  * 11/2017  ............. H10K 50/00
CN    107359258 A    11/2017
(Continued)

OTHER PUBLICATIONS

Machine translation, Cheng, Chinese Pat. Pub. No. CN111682121A, translation date: Aug. 25, 2023, Espacenet, all pages. (Year: 2023).*

(Continued)

*Primary Examiner* — Victoria K. Hall
(74) *Attorney, Agent, or Firm* — IPro, PLLC

(57) ABSTRACT

Provided is a display panel, including: a backplane; a first electrode and an auxiliary layer, disposed on a same side of the backplane, wherein a distance between a surface of the first electrode distal from the backplane and the backplane is shorter than or equal to a distance between a surface of the auxiliary layer distal from the backplane and the backplane; a pixel defining layer, at least partially disposed on a side of the auxiliary layer distal from the backplane; a second electrode, disposed on a side of the pixel defining layer distal from the backplane; and an auxiliary electrode, disposed on a side of the second electrode distal from the backplane, wherein an orthographic projection of the auxiliary electrode onto the backplane is located within an orthographic projection of the pixel defining layer onto the backplane.

16 Claims, 8 Drawing Sheets

(51) Int. Cl.
    *H10K 50/824*     (2023.01)
    *H10K 59/122*     (2023.01)
    *H10K 71/00*     (2023.01)
    *H10K 59/12*     (2023.01)

(56) References Cited

U.S. PATENT DOCUMENTS

| | | | |
|---|---|---|---|
| 2005/0153468 A1* | 7/2005 | Gupta | H10K 59/122 |
| | | | 438/21 |
| 2006/0158095 A1* | 7/2006 | Imamura | H10K 50/824 |
| | | | 313/506 |
| 2020/0328378 A1 | 10/2020 | Kim et al. | |

FOREIGN PATENT DOCUMENTS

| | | | | |
|---|---|---|---|---|
| CN | 110931653 A | * | 3/2020 | ........... H10K 50/822 |
| CN | 110931653 A | | 3/2020 | |
| CN | 111463250 A | | 7/2020 | |
| CN | 111682121 A | * | 9/2020 | ........... H10K 50/824 |
| CN | 111682121 A | | 9/2020 | |

OTHER PUBLICATIONS

Machine translation, Liu, Chinese Pat. Pub. No. CN107359258A, translation date: Aug. 25, 2023, Espacenet, all pages. (Year: 2023).*
Machine translation, Wan, Chinese Pat. Pub. No. CN110931653A, translation date: Aug. 25, 2023, Espacenet, all pages. (Year: 2023).*
CN202011140259.8 first office action.

* cited by examiner

US 11,985,864 B2

DISPLAY PANEL AND METHOD OF MANUFACTURING SAME, AND DISPLAY DEVICE

CROSS-REFERENCE TO RELATED APPLICATION

This application is based on and claims priority to the Chinese Patent Application No. 202011140259.8, filed on Oct. 22, 2020 and entitled "DISPLAY PANEL AND METHOD OF MANUFACTURING SAME, AND DISPLAY DEVICE", the disclosure of which is herein incorporated by reference in its entirety.

TECHNICAL FIELD

The present disclosure relates to the field of display technologies, and more particularly, to a display panel and a method of manufacturing the same, and a display device.

BACKGROUND

Compared with liquid crystal display (LCD) devices, organic light emitting diode (OLED) display devices are widely used in display, lighting and other fields due to the characteristics such as self-luminescence, high luminous efficiency, low working voltage, lightness and thinness, flexibility, simple manufacturing process and the like. The OLED display devices are classified into top emitting OLED display devices and bottom emitting OLED display devices based on different light-emitting surfaces. Due to the high aperture ratio thereof, the top emitting OLED display devices have become a focus of attention and widely studied.

The above information disclosed in this background section is only for enhancement of understanding the background of the embodiments of the present disclosure, and therefore it may include information that does not form the prior art that is already known to a person of ordinary skill in the art.

SUMMARY

The present disclosure provides a display panel and a method of manufacturing the same, and a display device. The technical solutions are as follows:

According to one aspect of the embodiments of the present disclosure, provided is a display panel. The display panel includes:

a backplane;

a first electrode and an auxiliary layer, disposed on a same side of the backplane, wherein a distance between a surface of the first electrode distal from the backplane and the backplane is shorter than or equal to a distance between a surface of the auxiliary layer distal from the backplane and the backplane;

a pixel defining layer, at least partially disposed on a side of the auxiliary layer distal from the backplane;

a second electrode, disposed on a side of the pixel defining layer distal from the backplane; and an auxiliary electrode, disposed on a side of the second electrode distal from the backplane, wherein an orthographic projection of the auxiliary electrode onto the backplane is located within an orthographic projection of the pixel defining layer onto the backplane.

Optionally, the auxiliary layer and the first electrode are disposed in a same layer and made of a same material.

Optionally, a gap is present between the auxiliary layer and the first electrode.

Optionally, the pixel defining layer includes a first portion and a second portion connected with the first portion, and wherein the first portion is located on the side of the auxiliary layer distal from the backplane, and the second portion is located within the gap between the auxiliary layer and the first electrode.

Optionally, the backplane includes an insulation layer, and wherein the insulation layer includes a groove and a protrusion, the first electrode is disposed within the groove, and a thickness of the first electrode is less than or equal to a depth of the groove.

Optionally, the protrusion is included in the auxiliary layer.

Optionally, the display panel further includes, a height-enhanced layer, disposed on a side of the protrusion distal from the backplane, wherein the height-enhanced layer and the protrusion are included in the auxiliary layer.

Optionally, the height-enhanced layer and the first electrode are disposed in a same layer and made of a same material.

Optionally, the display panel further includes, a light-emitting layer group, disposed between the pixel defining layer and the second electrode, wherein the light-emitting layer group covers the first electrode and the pixel defining layer.

Optionally, the display panel further includes: a protective layer, disposed on the side of the auxiliary electrode distal from the backplane.

Optionally, a height of the pixel defining layer is greater than or equal to 3 microns and less than or equal to 5 microns.

Optionally, the auxiliary layer is disposed in the same layer and made of the same material as the first electrode; and the pixel defining layer includes a first portion and a second portion connected with the first portion, wherein the first portion is located on the side of the auxiliary layer distal from the backplane, and the second portion is located within the gap between the auxiliary layer and the first electrode, wherein the display panel further includes:

a light-emitting layer group, disposed between the pixel defining layer and the second electrode, the light-emitting layer group covering the first electrode and the pixel defining layer; and a protective layer, disposed on a side of the auxiliary electrode distal from the backplane, and wherein a height of the pixel defining layer is greater than or equal to 3 microns and less than or equal to 5 microns.

According to another aspect of the embodiments of the present disclosure, provided is a method of manufacturing a display panel. The method includes.

providing a backplane;

forming a first electrode and an auxiliary layer on a same side of the backplane, wherein a distance between a surface of the first electrode distal from the backplane and the backplane is shorter than or equal to a distance between a surface of the auxiliary layer distal from the backplane and the backplane;

forming a pixel defining layer on a side of the auxiliary layer distal from the backplane, wherein at least part of the pixel defining layer is disposed on the side of the auxiliary layer distal from the backplane;

forming a second electrode on a side of the pixel defining layer distal from the backplane; and forming an auxiliary electrode on a side of the second electrode distal from the backplane, wherein an orthographic projection of the auxiliary electrode onto the backplane is located within an orthographic projection of the pixel defining layer onto the backplane.

Optionally, forming the auxiliary electrode on the side of the second electrode distal from the backplane includes:

providing a substrate, forming an auxiliary electrode material layer on the substrate;

covering a surface of the second electrode distal from the backplane with the substrate on which the auxiliary electrode material layer has been formed, and making the auxiliary electrode material layer contact with the second electrode;

rolling the substrate by a roller; and peeling off the substrate and retaining the auxiliary electrode material layer in contact with the second electrode, to form the auxiliary electrode.

Optionally, forming the first electrode and the auxiliary layer on the same side of the backplane includes:

forming a first electrode material layer on a side of the backplane; and patterning the first electrode material layer to form the first electrode and the auxiliary layer.

Optionally, the pixel defining layer includes a first portion located on the side of the auxiliary layer distal from the backplane, and the method further includes:

forming a gap between the first electrode and the auxiliary layer, wherein the pixel defining layer further includes a second portion connected with the first portion, and the second portion is located within the gap between the auxiliary layer and the first electrode.

Optionally, the backplane includes an insulation layer, and forming the first electrode and the auxiliary layer on the same side of the backplane further includes:

patterning the insulation layer to form a groove and a protrusion;

forming a first electrode material layer on a side of the backplane on which the groove has been formed;

patterning the first electrode material layer to form the first electrode; and forming the auxiliary layer by using the protrusion.

Optionally, the backplane includes an insulation layer, and forming the first electrode and the auxiliary layer on the same side of the backplane further includes:

patterning the insulation layer to form a groove and a protrusion;

forming a first electrode material layer on a side of the backplane on which the groove has been formed;

patterning the first electrode material layer to form the first electrode and a height-enhanced layer disposed on a side of the protrusion distal from the backplane; and forming the auxiliary layer by using the height-enhanced layer and the protrusion.

Optionally, the method further includes.

forming a light-emitting layer group on a side of the first electrode distal from the backplane, wherein the light-emitting layer group covers the first electrode and the pixel defining layer.

According to yet another aspect of the embodiments of the present disclosure, provided is a display device. The display device includes a power supply component and a display panel, the power supply component being connected to the display panel to supply power for the display panel, wherein the display panel includes:

a backplane;

a first electrode and an auxiliary layer, disposed on a same side of the backplane, and a distance between a surface of the first electrode distal from the backplane and the backplane is shorter than or equal to a distance between a surface of the auxiliary layer distal from the backplane and the backplane, a pixel defining layer, at least partially disposed on a side of the auxiliary layer distal from the backplane;

a second electrode, disposed on a side of the pixel defining layer distal from the backplane; and an auxiliary electrode, disposed on a side of the second electrode distal from the backplane, wherein an orthographic projection of the auxiliary electrode onto the backplane is located within an orthographic projection of the pixel defining layer onto the backplane.

BRIEF DESCRIPTION OF THE DRAWINGS

The above-mentioned and other features and advantages of the embodiments of the present disclosure will become more apparent by describing the exemplary embodiments thereof in detail with reference to the accompanying drawings.

The reference signs of the main components in the accompanying drawings are explained as follows:

1. backplane; 11. base substrate; 12. array substrate; 13. insulation layer; 14. groove; 15. protrusion;
first electrode; 21. first plane;
auxiliary layer; 31. second plane; 32. height-enhanced layer;
gap; 5. pixel defining layer; 6. light-emitting layer group; 7. second electrode; 8. auxiliary electrode; 9. protective layer; 10. black line; and
J1—power supply component, 00—display panel.

DETAILED DESCRIPTION

Exemplary embodiments will now be described more fully with reference to the accompanying drawings. However, the exemplary embodiments can be implemented in various forms, and should not be construed as being limited to the embodiments set forth herein; on the contrary, these implementations are provided to make the present disclosure be comprehensive and complete, and fully convey the concept of the exemplary embodiments to those skilled in the art. The same reference signs in the accompanying drawings indicate the same or similar structures, and thus their detailed descriptions will be conveyed.

Top emitting OLED display devices generally include a transparent cathode, an organic functional layer and a reflecting anode. Because the light emitted by the organic functional layer must pass through the transparent cathode, the transparent cathode needs to be made relatively thin to achieve high transmittance. However, the surface resistance of the transparent cathode becomes very large when the transparent cathode gets thinner. Furthermore, the voltage drop of the transparent cathode is particularly obvious, which may easily cause uneven brightness during the display.

Currently, in the related art, in order to ensure uniform brightness of the OLED display devices during the display, an auxiliary electrode 8 can be directly printed on an OLED display device. The auxiliary electrode 8 can reduce the resistance of the transparent cathode, and in turn reduce the voltage drop of the transparent cathode, which can ensure the uniform brightness of the display panel during the display. However, a limit width of the line of the auxiliary electrode 8 printed by the existing nozzle is about 20 micrometers (μm), and in this case, the auxiliary electrode 8 will cover the light-emitting area, causing a reduction in the aperture ratio and brightness of the display panel.

Figure 1:
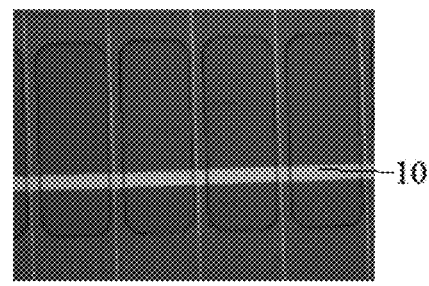
FIG. 1 is a schematic diagram of the effect of black lines appearing during the displaying in related art.
Figure 2:
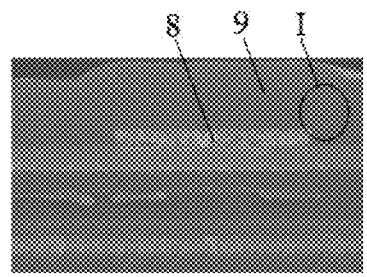
FIG. 2 is a schematic microstructure diagram of cracks appearing in the protective layer in the related art.
Figure 3:
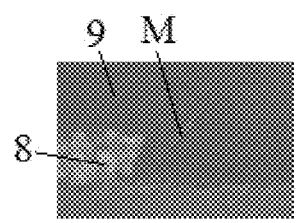
FIG. 3 is a partially enlarged schematic diagram of the I area marked in FIG. 2.

The transfer printing process is also used in some related art. However, the single maximum printing range of the transfer printing process is 450 mm (mm)*550 mm, and a 55-inch top emitting OLED display panel needs 4 times to complete the printing, which takes a long time. Furthermore, the printing film used in the transfer printing process is a soft film made of silicon-based material, thus deviation will be caused in the alignment process and thus the alignment accuracy will also become a challenge. In this case, the printing film is likely to cover the light-emitting area if the alignment is not well controlled. For example, as shown in FIG. 1, a black line 10 will appear when the top emitting OLED display panel is displaying. In addition, an edge of the auxiliary electrode 8 formed by the transfer printing process with a printing plate is relatively steep. When the protective layer 9 is subsequently formed by chemical vapor deposition (CVD), the protection layer 9 would easily form a crack M at the side of the auxiliary electrode 8, as shown in FIG. 2 and FIG. 3, and the encapsulation effect at the crack M is relatively weak.

Figure 4:
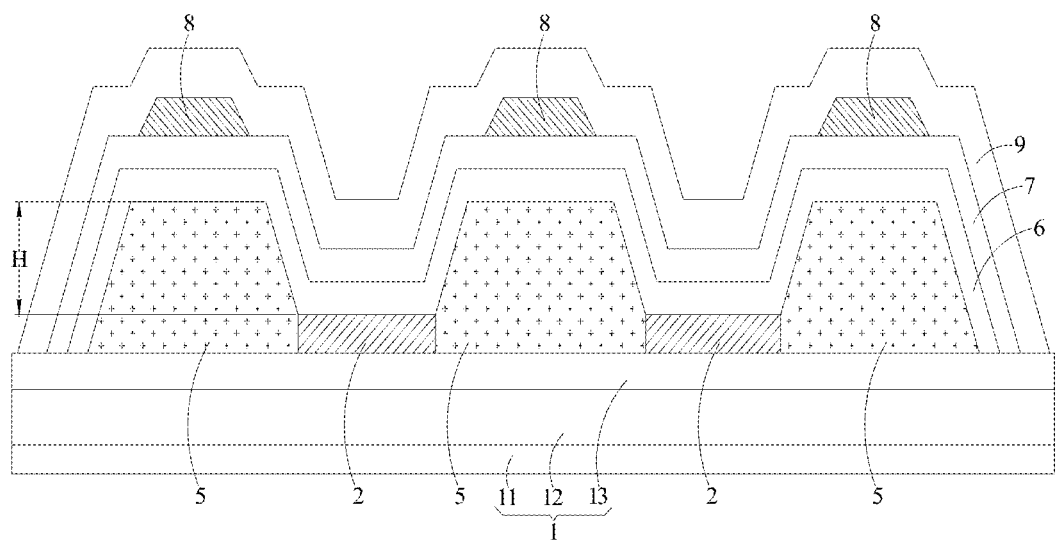
FIG. 4 is a schematic structural diagram of a display panel in the related art.

In order to improve the mass productivity of the transfer printing process, referring to FIG. 4, in the related art, a pixel defining layer 5 with a certain height can be used to act as a transfer printing plate, so that the auxiliary electrode 8 is directly left on the top of the pixel defining layer 5, thereby simplifying the process steps. However, in the top emitting display panel of the related art, the pixel defining layer 5 is directly disposed on a backplane 1, and a first electrode 2 is disposed on the backplane 1 spaced apart by the pixel defining layer 5. A height difference between the pixel defining layer 5 and the first electrode 2 is the effective height H when the pixel defining layer 5 is used as a transfer printing plate, and the height of the pixel defining layer 5 needs to be greater than 5 μm to act as a transfer printing plate. However, after testing, it is difficult to complete the production of the pixel defining layer 5 with such height at one time, and defects such as wrinkles are easy to appear at the edge of the pixel defining layer 5. In summary, it is difficult to manufacture the auxiliary electrode 8 at present.

Figure 5:
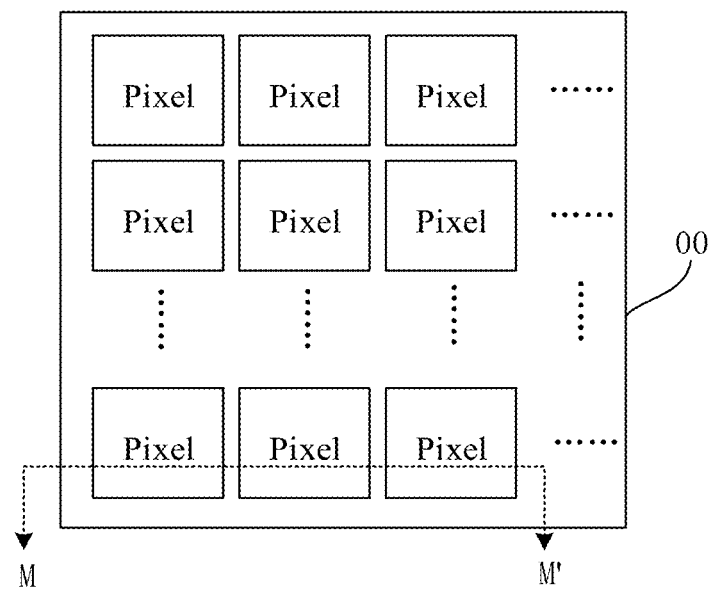
FIG. 5 is a schematic structural diagram of an exemplary implementation of a display panel of the present disclosure.

Some embodiments of the present disclosure first provide a display panel. Referring to FIG. 5, a top view of a display panel is shown, and the display panel 00 may include a plurality of pixels. Referring to FIG. 6 to FIG. 10, cross-sectional views of the display panel 00 shown in FIG. 5 along the MM' direction are shown.

Figure 6:
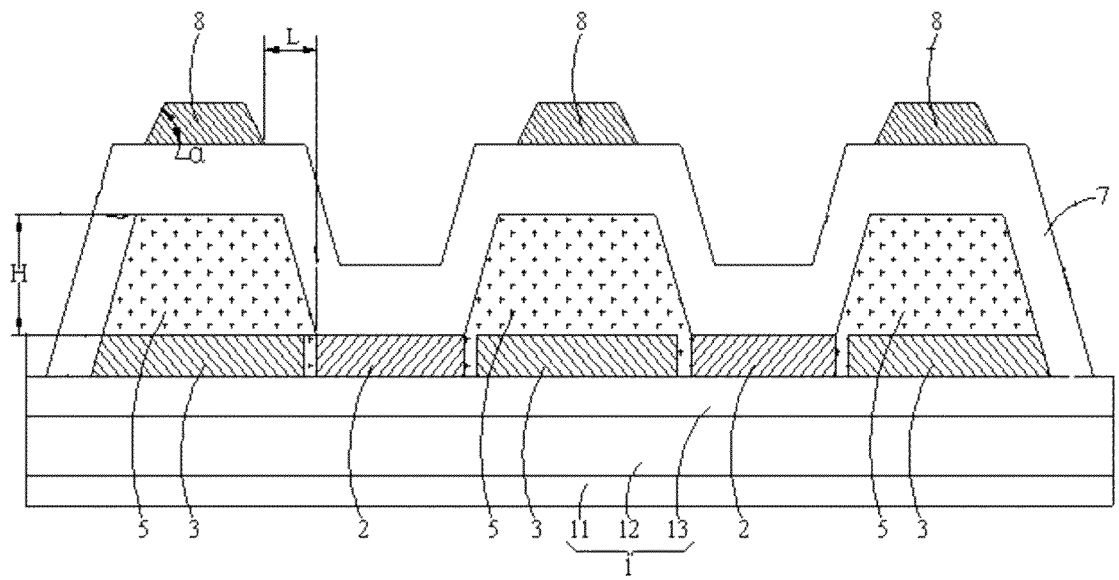
FIG. 6 is a schematic structural diagram of an exemplary implementation of a display panel of the present disclosure.
Figure 10:
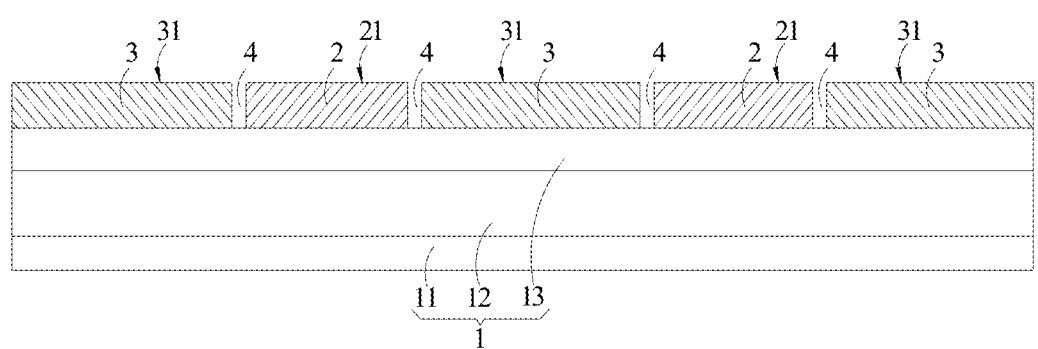
FIG. 10 is a schematic diagram showing the structure with the first electrode and the auxiliary layer being formed in a manufacturing process of a display panel according to the present disclosure.

It can be seen with reference to FIG. 6 and FIG. 10 that the display panel includes a backplane 1, a first electrode 2, an auxiliary layer 3, a pixel defining layer 5, a second electrode 7 and an auxiliary electrode 8.

Here, the first electrode 2 and the auxiliary layer 3 are disposed on the same side of the backplane 1, and a distance between a surface of the first electrode 2 distal from the backplane 1 and the backplane 1 is shorter than or equal to a distance between a surface of the auxiliary layer 3 distal from the backplane 1 and the backplane 1. That is, the first electrode 2 may be disposed on one side of the backplane 1, and the surface of the first electrode 2 distal from the backplane 1 is denoted as a first plane 21. The auxiliary layer 3 may be disposed on the same side of the backplane 1 as the first electrode 2, and the surface of the auxiliary layer 3 distal from the backplane 1 is denoted as a second plane 31. The second plane 31 may be coplanar with the first plane 21, or, the second plane 31 may be farther from the backplane 1 than the first plane 21. The pixel defining layer 5 is at least partially located on (i.e., disposed on) the side of the auxiliary layer 3 distal from the backplane 1. The second electrode 7 is located on (i.e., disposed on) the side of the pixel defining layer 5 distal from the backplane 1. The auxiliary electrode 8 is located on (i.e., disposed on) the side of the second electrode 7 distal from the backplane 1, and an orthographic projection of the auxiliary electrode 8 onto the backplane 1 is located within an orthographic projection of the pixel defining layer 5 onto the backplane 1.

In the display panel of the embodiments of the present disclosure, by disposing the pixel defining layer 5 on the side of the auxiliary layer 3 distal from the backplane 1, the base for forming the pixel defining layer 5 is relatively high. Correspondingly, the height requirement for using the pixel defining layer 5 as a transfer printing plate can be met by only producing the pixel defining layer 5 which may have a small height, so that defects such as wrinkles generated at the edge when producing the pixel defining layer 5 with a relatively great height can be avoided. In addition, by disposing the auxiliary electrode 8 on the side of the second electrode 7 distal from the backplane 1, the cross-sectional area of the second electrode 7 can be increased, so that the resistance of the second electrode 7 and the voltage drop can be reduced, thereby making the brightness more uniform during the display of the display panel.

In summary, the embodiments of the present disclosure provide a display panel that includes an auxiliary layer disposed on a side of the backplane. The pixel defining layer is disposed on a side of the auxiliary layer distal from the backplane, and the auxiliary electrode is disposed on a side of the pixel defining layer distal from the backplane. In this way, the base for forming the pixel defining layer can be higher, and the height requirement for using the pixel defining layer as a transfer printing plate can be met by only producing a pixel defining layer with a small height, which can reduce the difficulty in manufacturing pixel electrodes, and can also avoid wrinkles and other undesirable phenomena when producing the pixel defining layer with a relatively great height.

Figure 7:
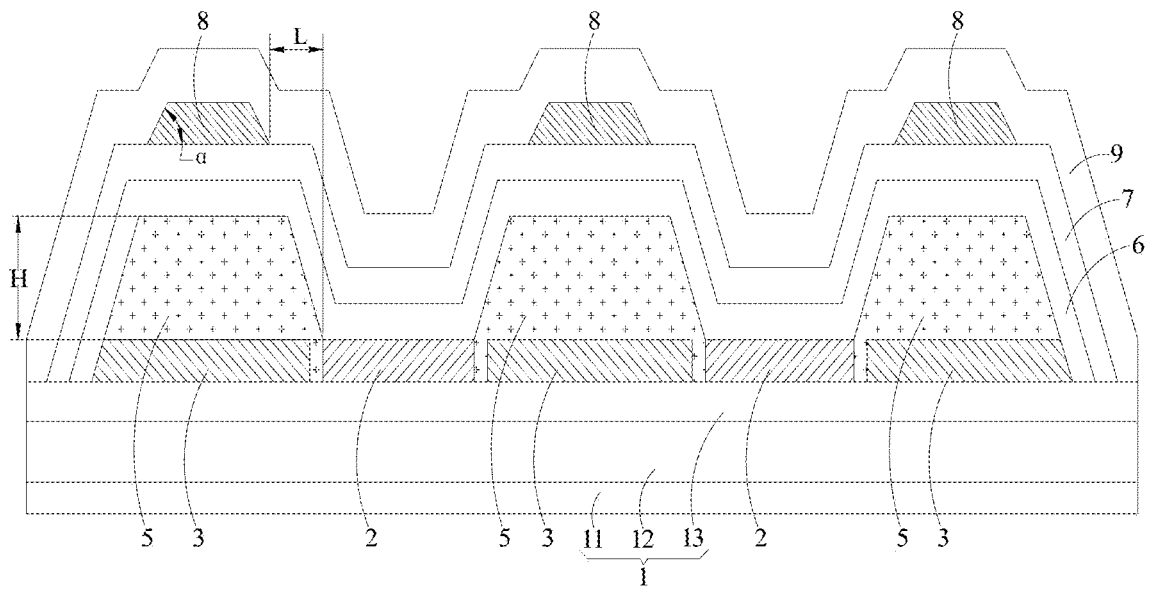
FIG. 7 is a schematic structural diagram of another exemplary implementation of a display panel of the present disclosure.

Optionally, referring to FIG. 7, it can be seen that the display panel provided by some embodiments of the present disclosure may further include a light-emitting layer group 6 disposed between the pixel defining layer 5 and the second electrode 7. That is, the light-emitting layer group 6 is disposed on the side of the first electrode 2 distal from the backplane 1.

Optionally, the light-emitting layer group 6 may at least cover the first electrode 2 and may further cover the pixel defining layer 5. Certainly, in other exemplary implementations of the embodiments of the present disclosure, the light-emitting layer group 6 may only cover the first electrode 2.

In some implementations of the embodiments of the present disclosure, as shown in FIG. 10, the backplane 1 may include a base substrate 11, an array substrate 12, and an insulating layer 13 that are sequentially stacked along a direction close to the first electrode 2. That is, the backplane 1 may include a base substrate 11, an array substrate 12 disposed on the base substrate 11, and an insulating layer 13 disposed on a side of the array substrate 12 distal from the base substrate 11. Here, the array substrate 12 may include a plurality of thin film transistors (not shown in the figure) arranged in an array.

In some implementations of the embodiments of the present disclosure, as shown in FIG. 10, the surface of the insulating layer 13 distal from the base substrate 11 may be flat, and the first electrode 2 and the auxiliary layer 3 are disposed on the surface of the insulating layer 13 distal from the base substrate 11.

Optionally, in some embodiments of the present disclosure, the auxiliary layer 3 and the first electrode 2 may be disposed in the same layer and made of the same material, that is, they are formed by the same patterning process. In this way, the process can be simplified, the cost can be saved, and the manufacturing efficiency can be improved. In addition, the distance between the surface of the auxiliary layer 3 distal from the backplane 1 and the backplane 1 may be equal to the distance between the surface of the first electrode 2 distal from the backplane 1 and the backplane 1, that is, the thickness of the auxiliary layer 3 and the thickness of the first electrode 2 may be same, or in other words, the second plane 31 and the first plane 21 may be coplanar.

Optionally, in some embodiments of the present disclosure, referring to FIG. 10, it can be seen that a gap 4 may exist (that is, may be provided) between the auxiliary layer 3 and the first electrode 2. The pixel defining layer 5 may include a first portion, and a second portion connected to the first portion. Here, the first portion may be located on the side of the auxiliary layer 3 distal from the backplane 1, and the second portion may be located (e.g., be deposited) in the gap 4 between the auxiliary layer 3 and the first electrode 2, so that the auxiliary layer 3 and the first electrode 2 are separated from each other. In this way, it can prevent the auxiliary layer 3 and the first electrode 2 from being connected to each other and causing a short circuit to affect the display effect.

Optionally, in some embodiments of the present disclosure, the first electrode 2 may be an anode of the display panel, and the first electrode 2 may include a first transparent layer, a reflective metal layer, and a second transparent layer.

In this case, the reflective metal layer may be disposed on a side of the first transparent layer distal from the backplane 1, and the second transparent layer may be disposed on a side of the reflective metal layer distal from the backplane 1.

Optionally, in some embodiments of the present disclosure, materials of the first transparent layer and the second transparent layer may include indium tin oxide (ITO) or indium zinc oxide (IZO). A material of the reflective metal layer may include metallic silver (Ag) or metallic aluminum (Al).

Optionally, in some embodiments of the present disclosure, the thickness of the first electrode 2 may be greater than or equal to 0.5 μm and less than or equal to 2 μm. The pixel defining layer 5 is disposed on the side of the auxiliary layer 3 distal from the backplane 1, and the height of the pixel defining layer 5 may be greater than or equal to 3 μm and less than or equal to 5 μm. In this case, when the pixel defining layer 5 is used as a transfer printing plate, the height of the pixel defining layer 5 per se is the effective height H when the pixel defining layer 5 functions as a transfer printing plate. In this case, the pixel defining layer 5 does not need to be made as having a great height to meet the height requirement for the transfer printing plate.

Figure 8:
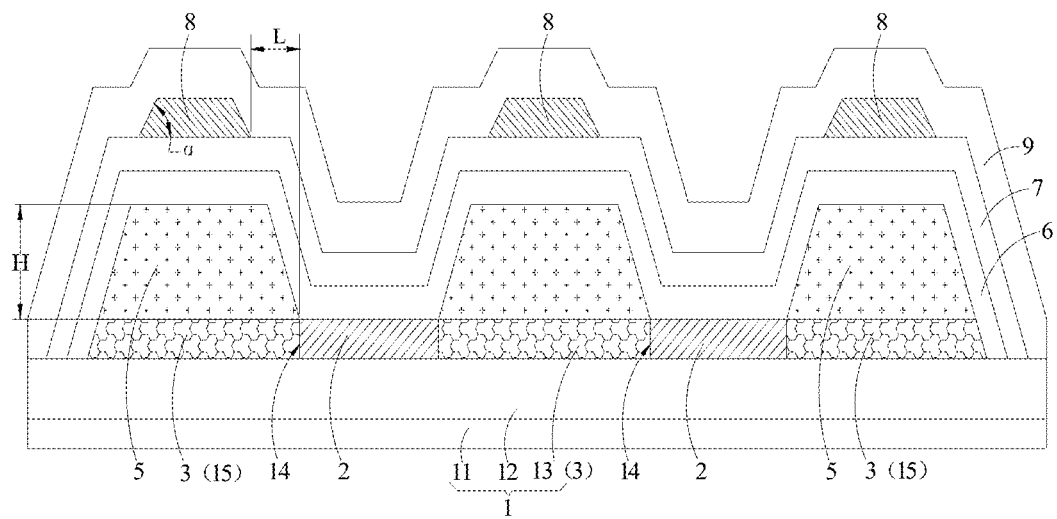
FIG. 8 is a schematic structural diagram of yet another exemplary implementation of a display panel of the present disclosure.

In addition, in some other exemplary implementations of the embodiments of the present disclosure, referring to the schematic structural diagram of another exemplary implementation of the display panel of the present disclosure shown in FIG. 8, it can be seen that the insulating layer 13 may include a groove 14 and a protrusion 15, and the groove 14 and the protrusion 15 may be disposed on the insulating layer 13.

Based on this, the groove 14 may be provided with the first electrode 2, and the first electrode 2 may be disposed within the groove 14. The protrusion 15 may be used to form the auxiliary layer 3, in other words, the auxiliary layer 3 may include the protrusion 15. That is, the groove 14 may be formed at a position where the first electrode 2 needs to be formed, and the protrusion 15 may be formed at a position where the pixel defining layer 5 needs to be formed.

Optionally, the thickness of the first electrode 2 may be equal to or less than the depth of the groove 14. Here, when the thickness of the first electrode 2 is equal to the depth of the groove 14, the second plane 31 and the first plane 21 can be coplanar, and the height of the pixel defining layer 5 per se is the effective height H when the pixel defining layer 5 is used as a transfer printing plate. When the thickness of the first electrode 2 is less than the depth of the groove 14, the second plane 31 would be farther from the backplane 1 than the first plane 21. The sum of the difference between the thickness of the first electrode 2 and the depth of the groove 14 plus the height of the pixel defining layer 5 is the effective height H when the pixel defining layer 5 is used as a transfer printing plate. In this case, even if the height of the pixel defining layer 5 is further reduced, the height requirement for the transfer printing plate can also be met.

Figure 9:
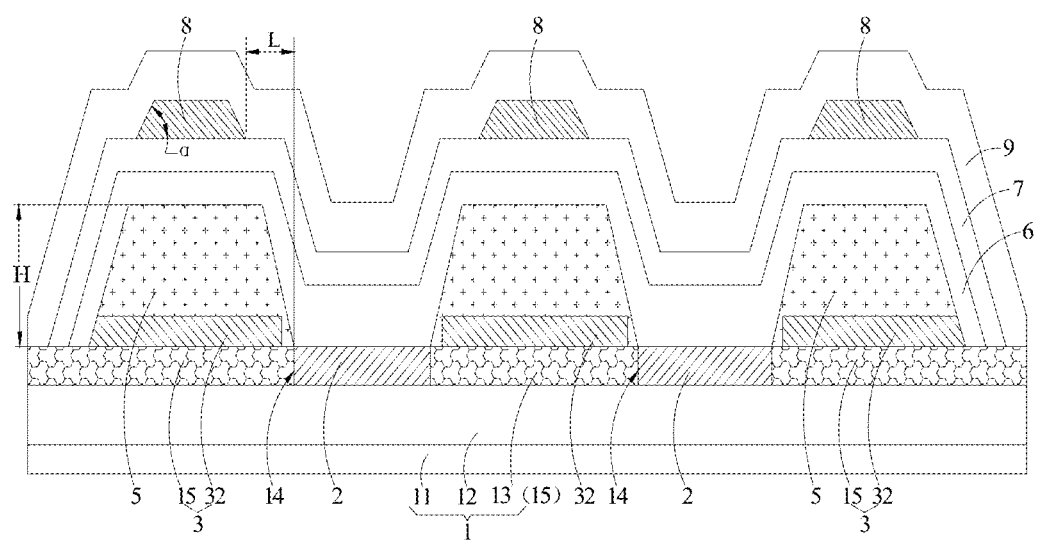
FIG. 9 is a schematic structural diagram of a further exemplary implementation of a display panel of the present disclosure.

Referring to the schematic structural diagram of a further exemplary implementation of the display panel of the present disclosure shown in FIG. 9, the difference between this exemplary implementation and the exemplary implementation shown in FIG. 8 lies in that the display panel here may further include a height-enhanced layer 32 disposed on a side of the protrusion 15 distal from the backplane 1. On this basis, the auxiliary layer 3 may include the height-enhanced layer 32 and the protrusion 15. That is, the height-enhanced layer 32 and the protrusion 15 can be used to form the auxiliary layer 3, so that the second plane 31 is farther from the backplane 1 than the first plane 21.

Optionally, for the structure shown in FIG. 9, the height-enhanced layer 32 and the first electrode 2 may be disposed in the same layer and made of the same material, that is, they are formed by the same patterning process but are not necessarily in the same plane. In this case, the process can be simplified, the cost can be saved, and the manufacturing efficiency can be improved.

Optionally, in some implementations of the present disclosure, a gap may still be provided between the height-enhanced layer 32 and the first electrode 2. As described in the above implementations, at least part of the pixel defining layer 5 may be deposited in the gap between the auxiliary layer 3 and the first electrode 2, so that the auxiliary layer 3 and the first electrode 2 are separated from each other, thereby preventing the auxiliary layer 3 and the first electrode 2 from being connected to each other and causing a short circuit to affect the display effect.

Optionally, the second electrode 7 described in the implementations of the present disclosure may be a transparent electrode, and the second electrode 7 may be a cathode of the display panel. The material of the second electrode 7 may include ITO, IZO, metallic magnesium (Mg) or metallic Ag. The material of the auxiliary electrode 8 may include Ag.

By disposing the auxiliary electrode 8 on the side of the second electrode 7 distal from the backplane 1, and making the orthographic projection of the auxiliary electrode 8 onto the backplane 1 be located within the orthographic projection of the pixel defining layer 5 onto the backplane 1, the cross-sectional area of the second electrode 7 can be increased, and the resistance and voltage drop of the second electrode 7 can be reduced, so as to make the brightness of the display panel during display more uniform.

Optionally, referring to FIG. 7 to FIG. 9, it can be seen that the display panel provided by some embodiments of the present disclosure may further include a protective layer 9, and the protective layer 9 may be disposed on the side of the auxiliary electrode 8 distal from the backplane 1. That is, the protective layer 9 may be disposed on the side of the auxiliary electrode 8 distal from the backplane 1.

Optionally, a material of the protective layer 9 may include silicon nitride, silicon oxide or silicon oxynitride.

In summary, the embodiments of the present disclosure provide a display panel that includes an auxiliary layer disposed on a side of the backplane, the pixel defining layer is disposed on a side of the auxiliary layer distal from the backplane, and the auxiliary electrode is disposed on a side of the pixel defining layer distal from the backplane. In this way, the base for forming the pixel defining layer can be higher, and the height requirement for using the pixel defining layer as a transfer printing plate can be met by only producing a pixel defining layer with a small height, which can reduce the difficulty in manufacturing pixel electrodes, and can also avoid wrinkles and other undesirable phenomena when producing the pixel defining layer with a relatively great height.

Figure 11:
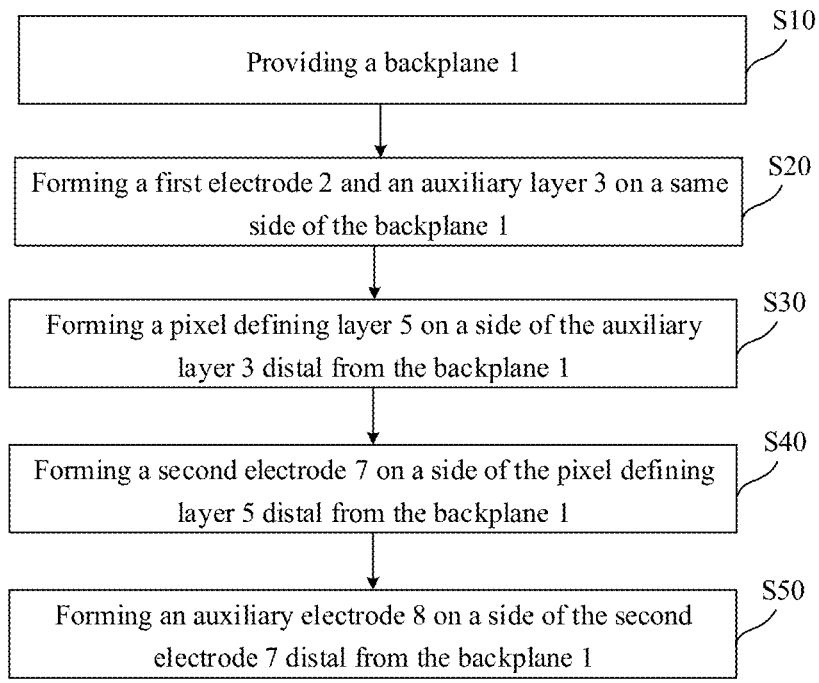
FIG. 11 is a schematic block diagram showing the flow of an exemplary implementation of a method of manufacturing a display panel of the present disclosure.

Further, some embodiments of the present disclosure also provide a method of manufacturing a display panel. As shown in FIG. 11, the manufacturing method may include the following steps.

In step S10, a backplane 1 is provided.

In step S20, a first electrode 2 and an auxiliary layer 3 are formed on the same side of the backplane 1.

Here, a distance between a surface of the first electrode 2 distal from the backplane 1 and the backplane 1 is shorter than or equal to a distance between a surface of the auxiliary layer 3 distal from the backplane 1 and the backplane 1. When the surface of the first electrode 2 distal from the backplane 1 is denoted as a first plane 21, and the surface of the auxiliary layer 3 distal from the backplane 1 is denoted as the second plane 31, then it is considered that the second plane 31 is coplanar with the first plane 21, or the second plane 31 is farther from the backplane 1 than the first plane 21.

In step S30, a pixel defining layer 5 is formed on a side of the auxiliary layer 3 distal from the backplane 1.

Here, at least part of the pixel defining layer 5 may be disposed on the side of the auxiliary layer 3 distal from the backplane 1.

In step S40, a second electrode 7 is formed on a side of the pixel defining layer 5 distal from the backplane 1.

In step S50, an auxiliary electrode 8 is formed on a side of the second electrode 7 distal from the backplane 1.

Here, the orthographic projection of the auxiliary electrode 8 onto the backplane 1 may be located within the orthographic projection of the pixel defining layer 5 onto the backplane 1.

Figure 12:
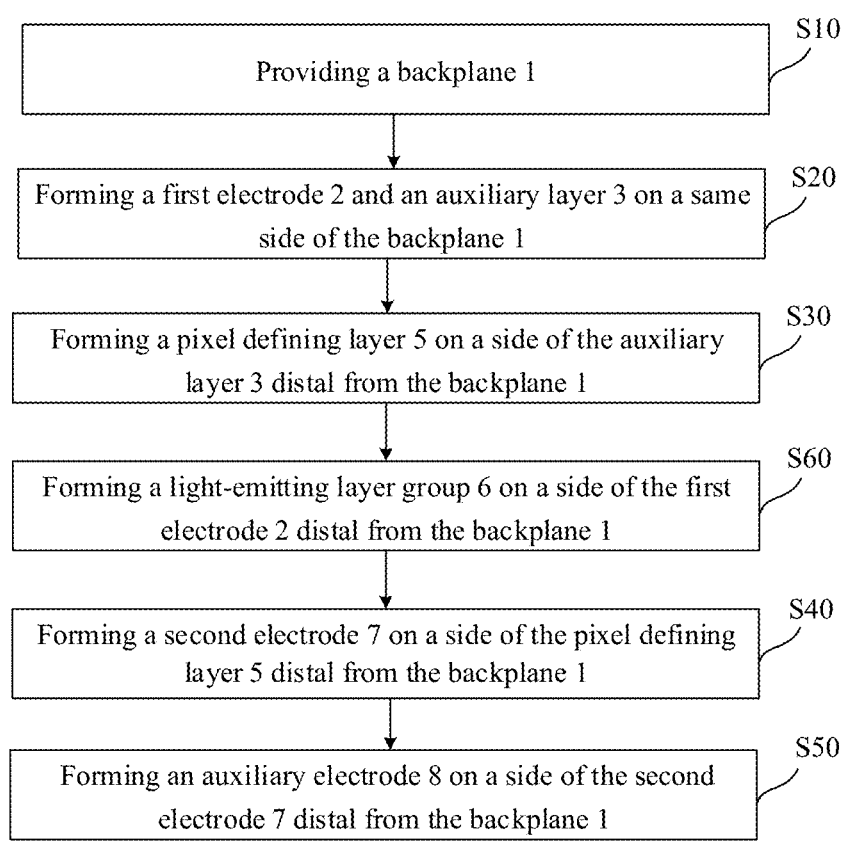
FIG. 12 is a schematic block diagram showing the flow of another exemplary implementation of a method of manufacturing a display panel of the present disclosure.

Optionally, referring to FIG. 12, it can be seen that after step S30, the method may further include:

step S60, a light-emitting layer group 6 is formed on a side of the first electrode 2 distal from the backplane 1.

That is, the light-emitting layer group 6 as formed may be located between the first electrode 2 and the second electrode 7, or it may be understood that the light-emitting layer group 6 is also located between the pixel defining layer 5 and the second electrode 7. Optionally, the light-emitting layer group 6 at least covers the first electrode 2 and may further cover the pixel defining layer 5.

Figure 13:
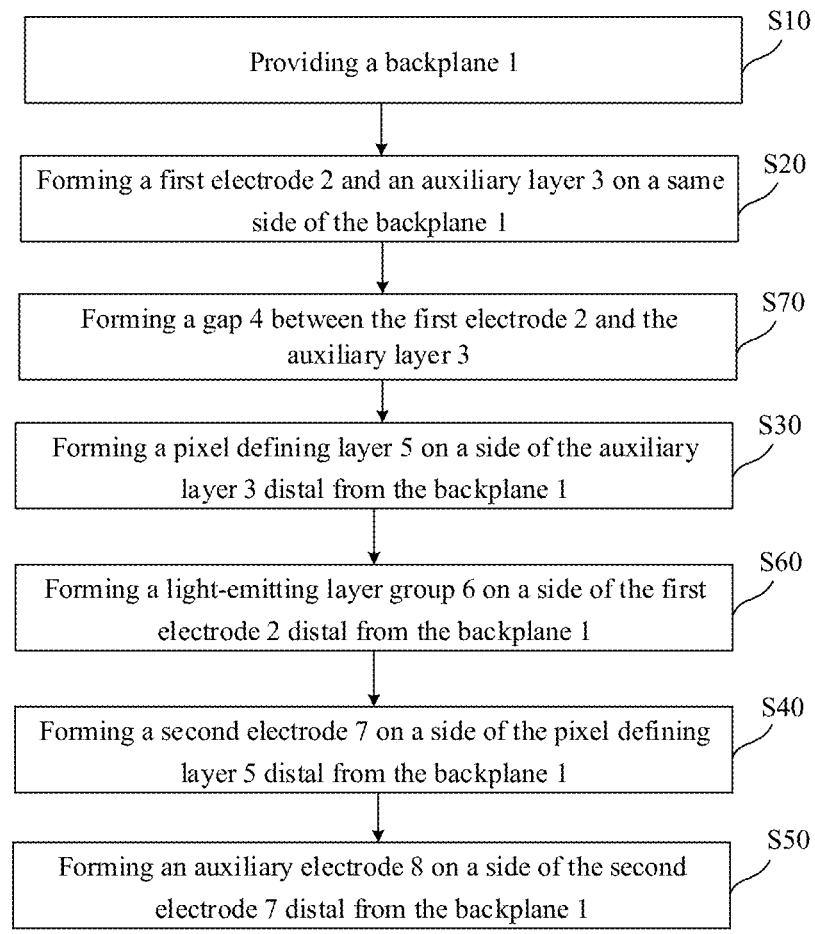
FIG. 13 is a schematic block diagram showing the flow of yet another exemplary implementation of a method of manufacturing a display panel of the present disclosure.

Optionally, in some embodiments of the present disclosure, a first electrode material layer is formed on a side of the backplane 1, and then the first electrode material layer is patterned to form the first electrode 2 and the auxiliary layer 3. Optionally, the pixel defining layer 5 may include a first portion located on a side of the auxiliary layer 3 distal from the backplane 1. After forming the first electrode 2 and the auxiliary layer 3, referring to FIG. 13, the method may further include.

step S70, forming a gap 4 between the first electrode 2 and the auxiliary layer 3.

Based on this, the pixel defining layer 5 may further include a second portion connected to the first portion, wherein the second portion may be located within the gap 4. In this way, the auxiliary layer 3 and the first electrode 2 are separated from each other, so as to prevent the auxiliary layer 3 and the first electrode 2 from being connected to each other and causing a short circuit to affect the display effect.

Optionally, in the embodiments of the present disclosure, a base substrate 11 is provided, thin film transistors arranged in an array are formed on the base substrate 11 to form the array substrate 12. Then, an insulating layer 13 is formed on a side of the array substrate 12 distal from the base substrate 11.

The first electrode material layer is formed on the side of the insulating layer 13 distal from the base substrate 11 by deposition, sputtering, evaporation or other methods. Referring to FIG. 10, the first electrode material layer is patterned to form the first electrode 2 and the auxiliary layer 3. Because the first electrode 2 and the auxiliary layer 3 are formed by the same patterning process, the thickness of the first electrode 2 and the thickness of the auxiliary layer 3 can be the same. Furthermore, as a surface of the insulating layer 13 distal from the backplane 1 is flat, a distance between a surface of the auxiliary layer 3 distal from the backplane 1 and the backplane 1 would be equal to a distance between a surface of the first electrode 2 distal from the backplane 1 and the backplane 1, that is, the first plane 21 and the second plane 31 are coplanar.

Figure 14:
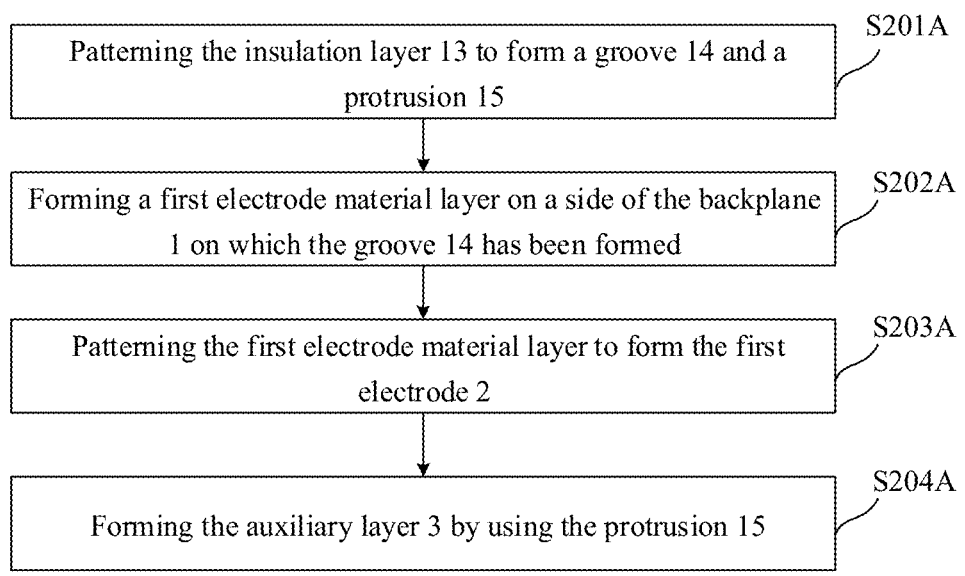
FIG. 14 is a schematic block diagram showing the flow of a method for forming a first electrode and an auxiliary layer in an exemplary implementation of a display panel according to the present disclosure.

In some implementations of the embodiments of the present disclosure, referring to FIG. 14, the step S20 may include the following steps.

In step S201A, the insulation layer 13 is patterned to form a groove 14 and a protrusion 15.

In step S202A, a first electrode material layer is formed on a side of the backplane 1 on which the groove 14 has been formed.

In step S203A, the first electrode material layer is patterned to form the first electrode 2.

That is, the first electrode 2 can be formed within the groove 14.

In step S204A, the auxiliary layer 3 is formed by using the protrusion 15.

Figure 15:
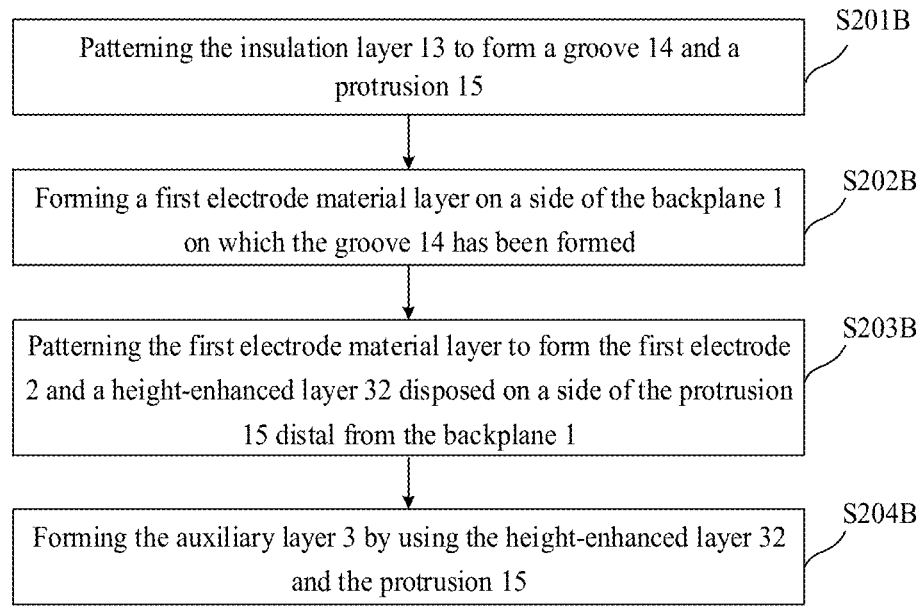
FIG. 15 is a schematic block diagram showing the flow of a method for forming a first electrode and an auxiliary layer in another implementation of a display panel according to the present disclosure.

In another implementation of the embodiments of the present disclosure, referring to FIG. 15, the step S20 may include the following steps.

In step S201B, the insulation layer 13 is patterned to form a groove 14 and a protrusion 15.

In step S202B, a first electrode material layer is formed on a side of the backplane 1 on which the groove 14 has been formed.

In step S203B, the first electrode material layer is patterned to form the first electrode 2, and a height-enhanced layer 32 disposed on a side of the protrusion 15 distal from the backplane 1.

In step S204B, the auxiliary layer 3 is formed by using the height-enhanced layer 32 and the protrusion 15.

Optionally, a gap may be formed between the first electrode 2 and the height-enhanced layer 32.

Optionally, in some embodiments of the present disclosure, the step S30 may include:

forming a pixel defining material layer on the side of the auxiliary layer 3 distal from the backplane 1 by deposition, sputtering, evaporation, or other methods, and then patterning the pixel defining material layer to form the pixel defining layer 5 so that the pixel defining layer 5 is only formed on the side of the auxiliary layer 3 distal from the backplane 1.

Optionally, in some embodiments of the present disclosure, the step S60 may include:

forming a light-emitting layer group 6 on the side of the first electrode distal from the backplane 1 by deposition, sputtering, evaporation, or other methods, wherein the light-emitting layer group 6 may cover the first electrode 2 and the pixel defining layer 5. Certainly, in other implementations of the embodiments of the present disclosure, the light-emitting layer group 6 may be only formed on the first electrode 2.

Based on this, the step S40 may include. forming the second electrode 7 on the side of the light-emitting layer group 6 distal from the backplane 1 by deposition, sputtering, evaporation, or other methods.

Figure 16:
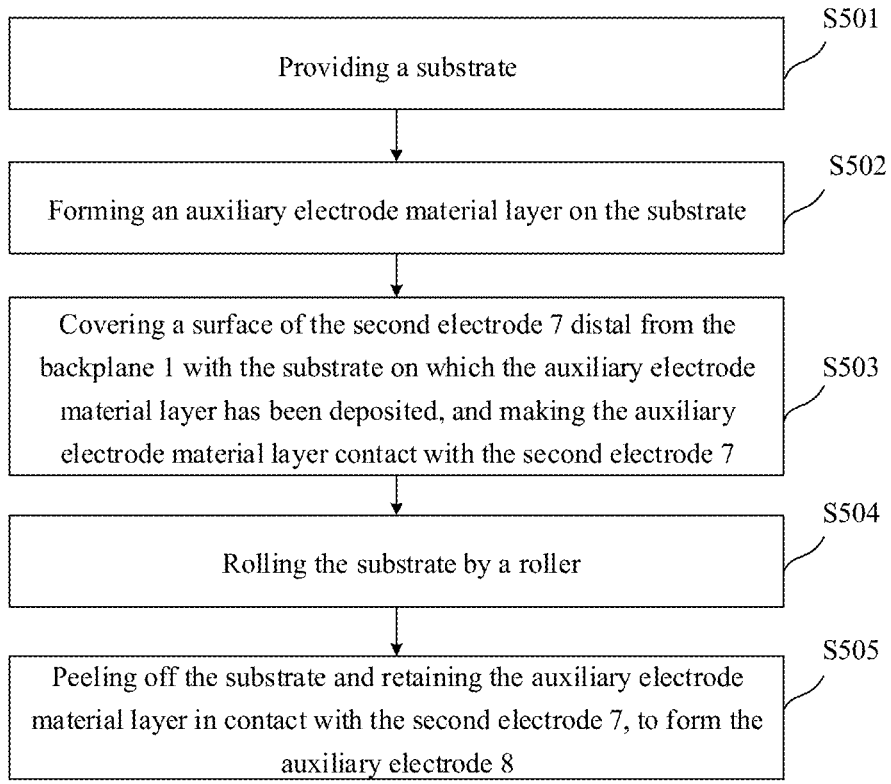
FIG. 16 is a schematic block diagram showing the flow of a method for forming an auxiliary electrode in an exemplary implementation of a display panel according to the present disclosure.

Optionally, in some embodiments of the present disclosure, referring to FIG. 16, the step S50 may include the following steps.

In step S501, a substrate is provided.

In step S502, an auxiliary electrode material layer is formed on the substrate.

Optionally, the auxiliary electrode material layer may be formed on the substrate by deposition, sputtering, evaporation, or other methods.

In step S503, the substrate on which the auxiliary electrode material layer has been deposited is overlaid on the surface of the second electrode 7 distal from the backplane 1, to make the auxiliary electrode material layer contact with the second electrode 7.

In step S504, the substrate is rolled by a roller.

In step S505, the auxiliary electrode 8 is formed by peeling off the substrate and retaining the auxiliary electrode material layer in contact with the second electrode 7.

As such, referring to FIG. 6 to FIG. 9, a distance L between an edge of the auxiliary electrode 8 and an edge of the pixel area may be greater than 6 microns, and the distance L is a safe distance, that is, the auxiliary electrode 8 would not be formed in the light-emitting area. Moreover, an edge angle $\alpha$ of the auxiliary electrode 8 may be less than 70°, that is, the inclination angle $\alpha$ of a side surface of the auxiliary electrode 8 is less than 70°. In this way, no cracks will be formed in the protective layer 9 when forming the layer through the subsequent deposition, sputtering, evaporation or other methods.

The patterning process described above may adopt methods such as photolithography, dry etching, wet etching or other methods according to requirements.

In summary, the embodiments of the present disclosure provide a method of manufacturing a display panel. In this method, an auxiliary layer is formed on a side of the backplane, the pixel defining layer is disposed on a side of the auxiliary layer distal from the backplane, and the auxiliary electrode is disposed on the side of the pixel defining layer distal from the backplane. In this way, the base for forming the pixel defining layer can be higher, and the height requirement for using the pixel defining layer as a transfer printing plate can be met by only producing a pixel defining layer with a small height, which can reduce the difficulty in manufacturing pixel electrodes, and can also avoid wrinkles and other undesirable phenomena when producing the pixel defining layer with a relatively great height.

Figure 17:
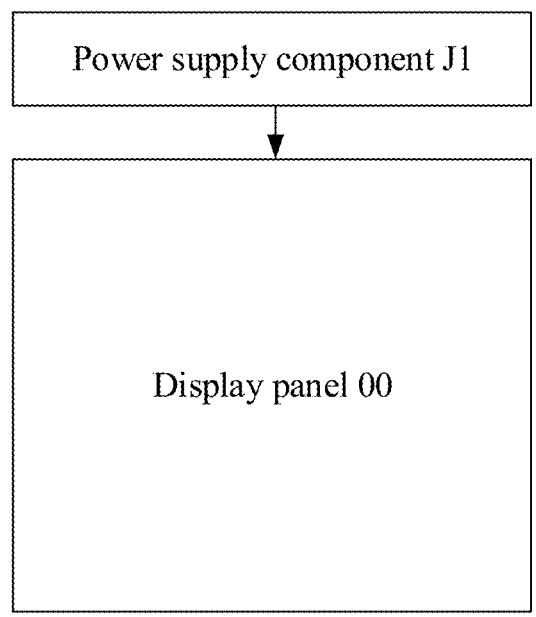
FIG. 17 is a schematic structural diagram of an exemplary implementation of a display device according to the present disclosure.

Further, referring to FIG. 17, the embodiments of the present disclosure also provide a display device. The display device may include a power supply component J1 and the display panel 00 shown in any one of FIG. 5 to FIG. 10.

Here, the power supply component J1 may be connected to the display panel 00 to supply power for the display panel 00. The specific structure of the display panel has been described in detail above, and will not be repeated here.

The specific type of the display device is not particularly limited, and can be any type of display devices that are commonly used, such as mobile devices such as mobile phones, wearable devices such as watches, virtual reality (VR) devices, etc. Persons skilled in the art can make a specific selection according to the specific purpose of the display device, which will not be repeated here.

It should be noted that, in addition to the display panel, the display device also includes other necessary components and elements. Taking a display as an example, it may further include a housing, a circuit board, or a power cord, and persons skilled in the art can make corresponding supplements according to the specific use requirements of the display device, which will not be repeated here.

Compared with the prior art, the beneficial effects of the display device provided by the embodiments of the present disclosure are the same as the beneficial effects of the display panel provided by the above-mentioned exemplary embodiments, which will not be repeated here.

The features, structures, or characteristics described above can be combined in one or more implementations in any suitable manner. If feasible, the features discussed in the respective embodiments are interchangeable. In the above description, many specific details are provided to give a sufficient understanding of the implementation of the embodiments of the present disclosure. However, those skilled in the art will realize that the technical solutions of the embodiments of the present disclosure can be practiced without one or more of the specific details, even other methods, components, materials, etc. can be used. In other cases, well-known structures, materials, or operations are not shown or described in detail to avoid obscuring aspects of the embodiments of the present disclosure.

Although relative terms such as "on" and "above" are used in this specification to describe the relative relationship of one component of an icon to another, these terms are used in this specification only for convenience, for example, according to the exemplary direction in the accompanying drawings. It can be understood that if the device of the icon is turned over and turned upside down, the component described as "on" will become the "above" component. Other relative terms such as "high", "low", "top" and "bottom" have similar meanings. When a structure is "on" another structure, it may mean that a certain structure is integrally formed on another structure, or that a certain structure is "directly" disposed on another structure, or that a certain structure is "indirectly" disposed on another structure through other structure. In this specification, the terms "a", "an" and "the" are used to indicate the presence of one or more elements/components/etc. The terms "including", "comprising" and "having" are used to express open-ended inclusion and mean that there may be additional elements/components/etc. in addition to the listed elements/components/etc. the terms "first", "second" and "third" are used to mark and are not a limit to the number of objects.

It should be understood that the present disclosure does not limit its application to the detailed structure and arrangement of components disclosed in the present specification. The present disclosure may have other embodiments, and can be implemented and executed in various manners. The aforementioned deformations and modifications fall within the scope of the embodiments of the present disclosure. It should be understood that the present disclosure disclosed and defined in the present specification extends to all alternative combinations of two or more individual features mentioned or obvious in the text and/or accompanying drawings. All these different combinations constitute multiple alternative aspects of the embodiments of the present disclosure. The implementations of the present specification illustrate known alternative ways for implementing the embodiments of the present disclosure, and will enable those skilled in the art to utilize the embodiments of the present disclosure

What is claimed is:

1. A display panel, comprising:
    a backplane;
    a first electrode and an auxiliary layer, disposed on a same side of the backplane, wherein a distance between a surface of the first electrode distal from the backplane and the backplane is shorter than or equal to a distance between a surface of the auxiliary layer distal from the backplane and the backplane;
    a pixel defining layer, at least partially disposed on a side of the auxiliary layer distal from the backplane;
    a second electrode, disposed on a side of the pixel defining layer distal from the backplane; and
    an auxiliary electrode, disposed on a side of the second electrode distal from the backplane, wherein an orthographic projection of the auxiliary electrode onto the backplane is located within an orthographic projection of the pixel defining layer onto the backplane;
    wherein the backplane comprises an insulation layer, and the insulation layer comprises a groove and a protrusion, the first electrode is disposed within the groove, and a thickness of the first electrode is less than or equal to a depth of the groove;
    the display panel further comprising:
    a height-enhanced layer, disposed on a side of the protrusion distal from the backplane, wherein the height-enhanced layer and the protrusion are comprised in the auxiliary layer.

2. The display panel according to claim 1, wherein the auxiliary layer and the first electrode are disposed in a same layer and made of a same material.

3. The display panel according to claim 1, wherein a gap is present between the auxiliary layer and the first electrode.

4. The display panel according to claim 3, wherein the pixel defining layer comprises a first portion and a second portion connected with the first portion, and
    wherein the first portion is located on the side of the auxiliary layer distal from the backplane, and the second portion is located within the gap between the auxiliary layer and the first electrode.

5. The display panel according to claim 1, wherein the height-enhanced layer and the first electrode are disposed in a same layer and made of a same material.

6. The display panel according to claim 5, wherein the auxiliary layer is disposed in the same layer and made of the same material as the first electrode; and
    the pixel defining layer comprises a first portion and a second portion connected with the first portion, wherein the first portion is located on the side of the auxiliary layer distal from the backplane, and the second portion is located within the gap between the auxiliary layer and the first electrode,
    wherein the display panel further comprises:
    a light-emitting layer group, disposed between the pixel defining layer and the second electrode, the light-emitting layer group covering the first electrode and the pixel defining layer; and
    a protective layer, disposed on a side of the auxiliary electrode distal from the backplane, and
    wherein a height of the pixel defining layer is greater than or equal to 3 microns and less than or equal to 5 microns.

7. The display panel according to claim 1, further comprising:

a light-emitting layer group, disposed between the pixel defining layer and the second electrode, wherein the light-emitting layer group covers the first electrode and the pixel defining layer.

8. The display panel according to claim 1, further comprising:
a protective layer, disposed on the side of the auxiliary electrode distal from the backplane.

9. The display panel according to claim 1, wherein a height of the pixel defining layer is greater than or equal to 3 microns and less than or equal to 5 microns.

10. A display device, comprising a power supply component and a display panel, the power supply component being connected to the display panel to supply power for the display panel,
wherein the display panel comprises:
a backplane;
a first electrode and an auxiliary layer, disposed on a same side of the backplane, and a distance between a surface of the first electrode distal from the backplane and the backplane is shorter than or equal to a distance between a surface of the auxiliary layer distal from the backplane and the backplane;
a pixel defining layer, at least partially disposed on a side of the auxiliary layer distal from the backplane;
a second electrode, disposed on a side of the pixel defining layer distal from the backplane; and
an auxiliary electrode, disposed on a side of the second electrode distal from the backplane, wherein an orthographic projection of the auxiliary electrode onto the backplane is located within an orthographic projection of the pixel defining layer onto the backplane;
wherein the backplane comprises an insulation layer, and the insulation layer comprises a groove and a protrusion, the first electrode is disposed within the groove, and a thickness of the first electrode is less than or equal to a depth of the groove;
wherein the display panel further comprises:
a height-enhanced layer, disposed on a side of the protrusion distal from the backplane, wherein the height-enhanced layer and the protrusion are comprised in the auxiliary layer.

11. A method of manufacturing a display panel, the method comprising:
providing a backplane;
forming a first electrode and an auxiliary layer on a same side of the backplane, wherein a distance between a surface of the first electrode distal from the backplane and the backplane is shorter than or equal to a distance between a surface of the auxiliary layer distal from the backplane and the backplane;
forming a pixel defining layer on a side of the auxiliary layer distal from the backplane, wherein at least part of the pixel defining layer is disposed on the side of the auxiliary layer distal from the backplane;
forming a second electrode on a side of the pixel defining layer distal from the backplane; and
forming an auxiliary electrode on a side of the second electrode distal from the backplane, wherein an orthographic projection of the auxiliary electrode onto the backplane is located within an orthographic projection of the pixel defining layer onto the backplane;

wherein forming the auxiliary electrode on the side of the second electrode distal from the backplane comprises:
providing a substrate;
forming an auxiliary electrode material layer on the substrate;
covering a surface of the second electrode distal from the backplane with the substrate on which the auxiliary electrode material layer has been formed, and making the auxiliary electrode material layer contact with the second electrode;
rolling the substrate by a roller; and
peeling off the substrate and retaining the auxiliary electrode material layer in contact with the second electrode, to form the auxiliary electrode.

12. The method according to claim 11, wherein forming the first electrode and the auxiliary layer on the same side of the backplane comprises:
forming a first electrode material layer on a side of the backplane; and
patterning the first electrode material layer to form the first electrode and the auxiliary layer.

13. The method according to claim 11, wherein the pixel defining layer comprises a first portion located on the side of the auxiliary layer distal from the backplane, and the method further comprises:
forming a gap between the first electrode and the auxiliary layer, wherein the pixel defining layer further comprises a second portion connected with the first portion, and the second portion is located within the gap between the auxiliary layer and the first electrode.

14. The method according to claim 11, wherein the backplane comprises an insulation layer, and forming the first electrode and the auxiliary layer on the same side of the backplane further comprises:
patterning the insulation layer to form a groove and a protrusion;
forming a first electrode material layer on a side of the backplane on which the groove has been formed;
patterning the first electrode material layer to form the first electrode; and
forming the auxiliary layer by using the protrusion.

15. The method according to claim 11, wherein the backplane comprises an insulation layer, and forming the first electrode and the auxiliary layer on the same side of the backplane further comprises:
patterning the insulation layer to form a groove and a protrusion;
forming a first electrode material layer on a side of the backplane on which the groove has been formed;
patterning the first electrode material layer to form the first electrode and a height-enhanced layer disposed on a side of the protrusion distal from the backplane; and
forming the auxiliary layer by using the height-enhanced layer and the protrusion.

16. The method according to claim 11, further comprising:
forming a light-emitting layer group on a side of the first electrode distal from the backplane, wherein the light-emitting layer group covers the first electrode and the pixel defining layer.

* * * * *

UNITED STATES PATENT AND TRADEMARK OFFICE
CERTIFICATE OF CORRECTION

| | | |
|---|---|---|
| PATENT NO. | : 11,985,864 B2 | Page 1 of 1 |
| APPLICATION NO. | : 17/506532 | |
| DATED | : May 14, 2024 | |
| INVENTOR(S) | : Xinxin Wang | |

It is certified that error appears in the above-identified patent and that said Letters Patent is hereby corrected as shown below:

On the Title Page

Item (73) should read:
(73) Assignees: Hefei BOE Joint Technology Co., Ltd., Hefei, Anhui (CN); BOE Technology Group Co., Ltd., Beijing (CN)

Signed and Sealed this
Twenty-ninth Day of July, 2025

Coke Morgan Stewart
*Acting Director of the United States Patent and Trademark Office*